United States Patent
Malhi et al.

(10) Patent No.: US 6,917,788 B2
(45) Date of Patent: Jul. 12, 2005

(54) WIRELESS COMMUNICATIONS SYSTEM HAVING VARIABLE GAIN MIXER

(75) Inventors: Duljit S. Malhi, North Andover, MA (US); Mark S. Bailly, Litchfield, NH (US)

(73) Assignee: International Business Machines Corporation, Armonk, NY (US)

(*) Notice: Subject to any disclaimer, the term of this patent is extended or adjusted under 35 U.S.C. 154(b) by 868 days.

(21) Appl. No.: 09/921,077

(22) Filed: Aug. 2, 2001

(65) Prior Publication Data

US 2003/0027531 A1 Feb. 6, 2003

(51) Int. Cl.[7] .............................. H04B 1/40
(52) U.S. Cl. .................. 455/76; 455/250.1; 455/254
(58) Field of Search ................ 455/73, 76, 232.1, 455/239.1, 250.1, 254, 323, 326, 333

(56) References Cited

U.S. PATENT DOCUMENTS

| | | | |
|---|---|---|---|
| 5,170,495 A | * 12/1992 | McNicol et al. | 455/116 |
| 5,589,791 A | 12/1996 | Gilbert | 327/359 |
| 5,675,392 A | 10/1997 | Nayebi et al. | 348/584 |
| 5,844,449 A | 12/1998 | Abeno et al. | 332/105 |
| 5,933,771 A | 8/1999 | Tiller et al. | 455/333 |
| 6,054,889 A | 4/2000 | Kobayashi | 327/357 |
| 6,084,466 A | 7/2000 | Phanse et al. | 327/560 |
| 6,118,339 A | 9/2000 | Gentzler et al. | 330/149 |
| 6,219,531 B1 | * 4/2001 | Roberts et al. | 455/73 |

* cited by examiner

Primary Examiner—Ahmad F. Matar
Assistant Examiner—Quynh H. Nguyen
(74) Attorney, Agent, or Firm—RatnerPrestia; Joseph P. Abate

(57) ABSTRACT

A wireless communications transceiver system and a variable gain mixer used in the wireless communications transceiver system. The differential mixed output signal of the variable gain mixer is a constant current signal. The gain of the mixer is set by selectively connecting into the input section circuit of the mixer a degeneration impedance. By maintaining the current of the mixed output signal constant, the linearity of the variable gain mixer is maintained constant and there are no changes in harmonic rejection.

20 Claims, 7 Drawing Sheets

WIRELESS COMMUNICATIONS SYSTEM HAVING VARIABLE GAIN MIXER

TECHNICAL FIELD

The present invention relates, in general, to wireless communications systems and, in particular, to adjusting the power of a wireless communications system so that the dynamic range of the system can accommodate the appropriate wireless standard.

BACKGROUND OF THE INVENTION

Referring to FIG. 1, which is a block diagram of a conventional wireless communications transceiver system, an incoming input signal having a radio frequency carrier modulated by an incoming baseband signal component, for example an audio signal component, is received by an antenna 10 and is conducted through a diplexer 11 to a low noise amplifier 12 where it is amplified. The frequency of the amplified radio frequency signal is converted to an intermediate frequency signal by a radio frequency mixer 14 and the intermediate frequency signal is amplified by a variable gain amplifier 16. The amplified intermediate frequency signal is converted to a low frequency signal by an intermediate frequency mixer 18 and the low frequency signal is amplified by a variable gain amplifier 20. The amplified low frequency signal is supplied to a demodulator 22 where it is demodulated to detect the incoming audio component and the incoming audio component is amplified by an audio amplifier 24 and supplied to a speaker 26 from which a user hears the incoming audio component carried by the incoming radio frequency signal.

This conventional wireless communications transceiver system also has a microphone 28 that receives an audio input from a user and develops an audio signal that is amplified by an audio amplifier 30 and modulates, in a modulator 32, a low frequency signal. This modulated low frequency signal is amplified by a variable gain amplifier 34 and the amplified low frequency signal is converted to an intermediate frequency signal by an IF mixer 36. The intermediate frequency signal is amplified by a variable gain amplifier 38 and the amplified intermediate frequency signal is converted to a radio frequency signal by an RF mixer 40. The radio frequency signal is amplified by a driver amplifier 42 and the amplified radio frequency signal is conducted through diplexer 11 to antenna 10 for transmission.

Generally, mixers in communications equipment have a fixed gain. Examples of such mixers are Gilbert cell mixers, FET mixers, and diode mixers.

Referring to FIG. 2, which is a circuit diagram of a conventional Gilbert cell mixer included in a conventional wireless communications transceiver system, this mixer circuit includes a mixer core circuit or mixer quad composed of a plurality of transistors 50, 52, 54, and 56. The mixer quad provides a switching action at a rate equal to the frequency of a local oscillator signal applied at a local oscillator port LO P and LO N. This switching action, responsive also to two current signals supplied from the collectors of a pair of transistors 58 and 60 in an input section circuit, converts the frequency of an input signal applied at an input port IN P and IN N to a different frequency output signal that is produced at an output port OUT P and OUT N. The input section circuit also includes a pair current sources 62 and 64 connected in series with transistors 58 and 60, respectively, and a resistor 66 connected between the emitters of transistor 58 and 60.

In a transmitter application, the signal applied at input port IN P and IN N is an intermediate frequency signal and the local oscillator switching action produces a radio frequency signal at output port OUT P and OUT N. In a receiver application, the signal applied at input port IN P and IN N is a radio frequency signal and the local oscillator switching action produces an intermediate frequency signal at output port OUT P and OUT N. The input section circuit serves to translate a voltage input signal into two current signals supplied to the mixer quad from the collectors of transistors 58 and 60.

In the absence of any voltage difference between the base of transistor 58 and the base of transistor 60, the collector currents of these two transistors are essentially equal. Thus, a voltage applied to the local oscillator port LO P and LO N results in no change of output current. Should a small DC offset voltage be present at the input port IN P and IN N (e.g., due to a mismatch in the emitter areas of transistors 58 and 60), this will only result in a small feed through of the local oscillator signal to the output port OUT P and OUT N which will be blocked by a first filter (not shown). Conversely, if an input signal is applied to the input port IN P and IN N, but no voltage difference is applied to the local oscillator port LO P and LO N, the output currents will again be balanced. A small offset voltage (due now to emitter mismatch in transistors 50, 52, 54 and 56) may cause some input signal feed through to the output port OUT P and OUT N.

As before, this will be rejected by the filter. Thus, it is only when a signal supplied to both the local oscillator port LO P and LO N and the input port IN P and IN N that a signal appears at the output port OUT P and OUT N.

If the loads 68, 70, 72, and 74 are purely resistive and equal, the gain is of the circuit is approximately equal to Z/R where Z is the impedance of each of the loads 68, 70, 72, and 74 and R is the resistance of a resistor 66. Transistors 58 and 60 modulate the outputs of current sources 62 and 64 at the frequency of the signal at input port IN P and IN N and provide a high impedance to the emitters of transistors 68, 70, 72, and 74 of the mixer quad. This high impedance improves the common-mode rejection of the circuit.

Resistor 66 also acts as emitter degeneration that provides increased linearity at the input of the mixer. One measure of mixer linearity is the power gain compression point OP1 dB. This parameter can be measured at the input IP1 dB or at the output OP1 dB. OP1 dB is equal to IP1 dB plus the gain of the mixer.

As indicated, variable gain amplifiers are provided in both the receiver chain and the transmitter chain. The gain in each chain is adjusted based on the levels of the received and transmitted signals and what is needed to maintain appropriate signal levels. As arranged in FIG. 1, the wireless communications transceiver system is more complex than desired and requires more space than desired.

It has been suggested in the past to arrange the mixers with variable gains to improve the facility to adjust the power of a wireless communications system. While variable gain mixers add to the facility to adjust the power of a wireless communications system, typically there is a loss in linearity and a loss in the rejection of harmonics.

SUMMARY OF THE INVENTION

Accordingly, it is an object of the present invention to provide a new and improved wireless communications transceiver system.

It is another object of the present invention to provide a new and improved variable gain mixer for a wireless communications transceiver system.

A wireless communications transceiver system, constructed in accordance with the present invention, includes an antenna for receiving an incoming radio frequency input signal having a radio frequency carrier modulated by an incoming audio signal component and a low noise amplifier for amplifying the radio frequency input signal. Also included in this system is a first radio frequency variable gain mixer having (a) means for supplying a first local oscillator signal, (b) a first input section circuit responsive to the amplified radio frequency input signal for translating the amplified radio frequency input signal from a voltage signal to first and second constant current signals, and (c) a first mixer core circuit responsive to the first and second constant current signals and the first local oscillator signal for developing a differential mixed intermediate frequency input signal. A wireless communications transceiver system, constructed in accordance with the present invention, further includes a first intermediate frequency variable gain mixer having (a) means for supplying a second local oscillator signal, (b) a second input section circuit responsive to the differential mixed intermediate frequency input signal for translating the differential mixed intermediate frequency input signal from a voltage signal to third and fourth constant current signals, and (c) a mixer core circuit responsive to the third and fourth constant current signals and the second local oscillator signal for developing a differential mixed low frequency input signal. A demodulator detects the incoming audio signal component from the differential mixed low frequency input signal and a first audio amplifier amplifies the incoming audio signal component and supplies the amplified audio signal component to a speaker for converting the amplified incoming audio signal component to incoming audio. A wireless communications transceiver system, constructed in accordance with the present invention, also includes a microphone for converting outgoing audio to an outgoing audio signal component, a second audio amplifier for amplifying the outgoing audio signal component and a modulator for developing an outgoing low frequency output signal having a low frequency carrier modulated by the outgoing audio signal component. Also included in this system is a second intermediate frequency variable gain mixer having (a) means for supplying a third local oscillator signal, (b) a third input section circuit responsive to the low frequency output signal for translating the low frequency output signal from a voltage signal to fifth and sixth constant current signals, and (c) a third mixer core circuit responsive to the fifth and sixth constant current signals and the third local oscillator signal for developing a differential mixed intermediate frequency output signal. A wireless communications transceiver system, constructed in accordance with the present invention, further includes a second radio frequency variable gain mixer having (a) means for supplying a fourth local oscillator signal, (b) a fourth input section circuit responsive to the intermediate frequency output signal for translating the intermediate frequency output signal from a voltage signal to seventh and eighth constant current signals, and (c) a fourth mixer core circuit responsive to the seventh and eighth constant current signals and the fourth local oscillator signal for developing a differential mixed radio frequency output signal. A driver amplifier amplifies the radio frequency output signal and supplies the amplified radio frequency output signal to an antenna for transmitting the amplified radio frequency output signal.

A variable gain mixer, constructed in accordance with the present invention, includes means for supplying a first input signal and means for supplying a second input signal. This mixer also includes an input section circuit responsive to the first input signal for translating the first input signal from a voltage signal to first and second constant current signals. The input section circuit has a plurality of pairs of transducers with each pair of transducers connected in a differential configuration. The outputs of a first of each pair of transducers are connected together for supplying a first of the first and second constant current signals and the outputs of a second of each pair of transducers are connected together for supplying a second of the first and second constant current signals. The inputs of a first of each pair of transducers are connected together for receiving the first input signal and the inputs of a second of each pair of transducers are connected together and for receiving the first input signal. The input section circuit of the mixer also has a plurality of resistors each connected between a first of each pair of the transducers and a second of each pair of the transducers and a plurality of pairs of constant current sources, a first of each pair connected in series with a first of each pair of the transducers and a second of each pair connected in series with a second of each pair of the transducers. The input section circuit of the mixer further has means for selectively activating a pair of the constant current sources to produce the first constant current signal at the output of the transducer connected in series with the activated first constant current source and the second constant current signal at the output of the transducer connected in series with the activated second constant current source. A variable gain mixer, constructed in accordance with the present invention, further includes a mixer core circuit responsive to the first and second constant current signals and the second input signal for developing a differential mixed output signal that is the product of the constant current signals and the second input signal.

It is to be understood that the foregoing general description of the present invention and the following detailed description of the present invention are exemplary, but are not restrictive of the invention.

DETAILED DESCRIPTION OF THE INVENTION

Figure 1:
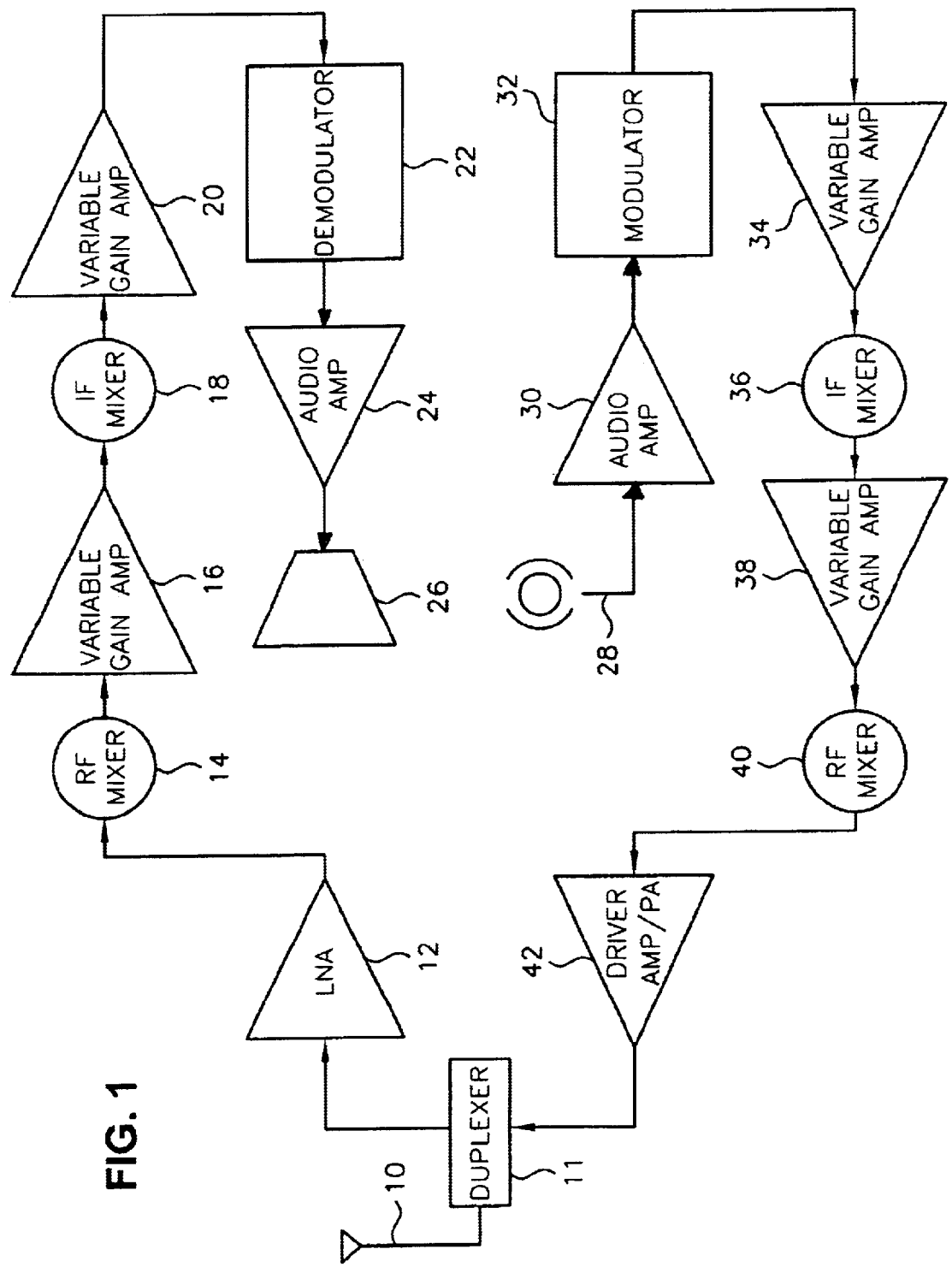
FIG. 1 is a block diagram of a conventional wireless communications transceiver system.
Figure 2:
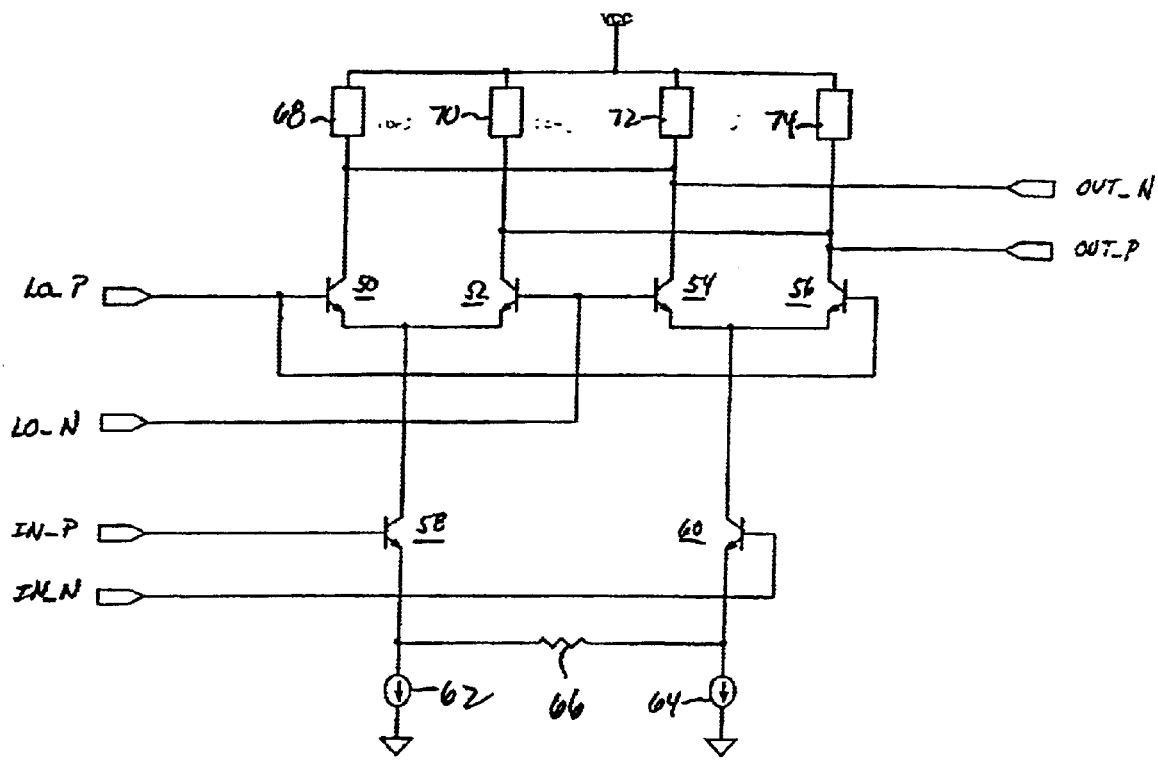
FIG. 2 is a circuit diagram of a conventional mixer that can be included in a conventional wireless communications transceiver system such as the one illustrated in FIG. 1.
Figure 3:
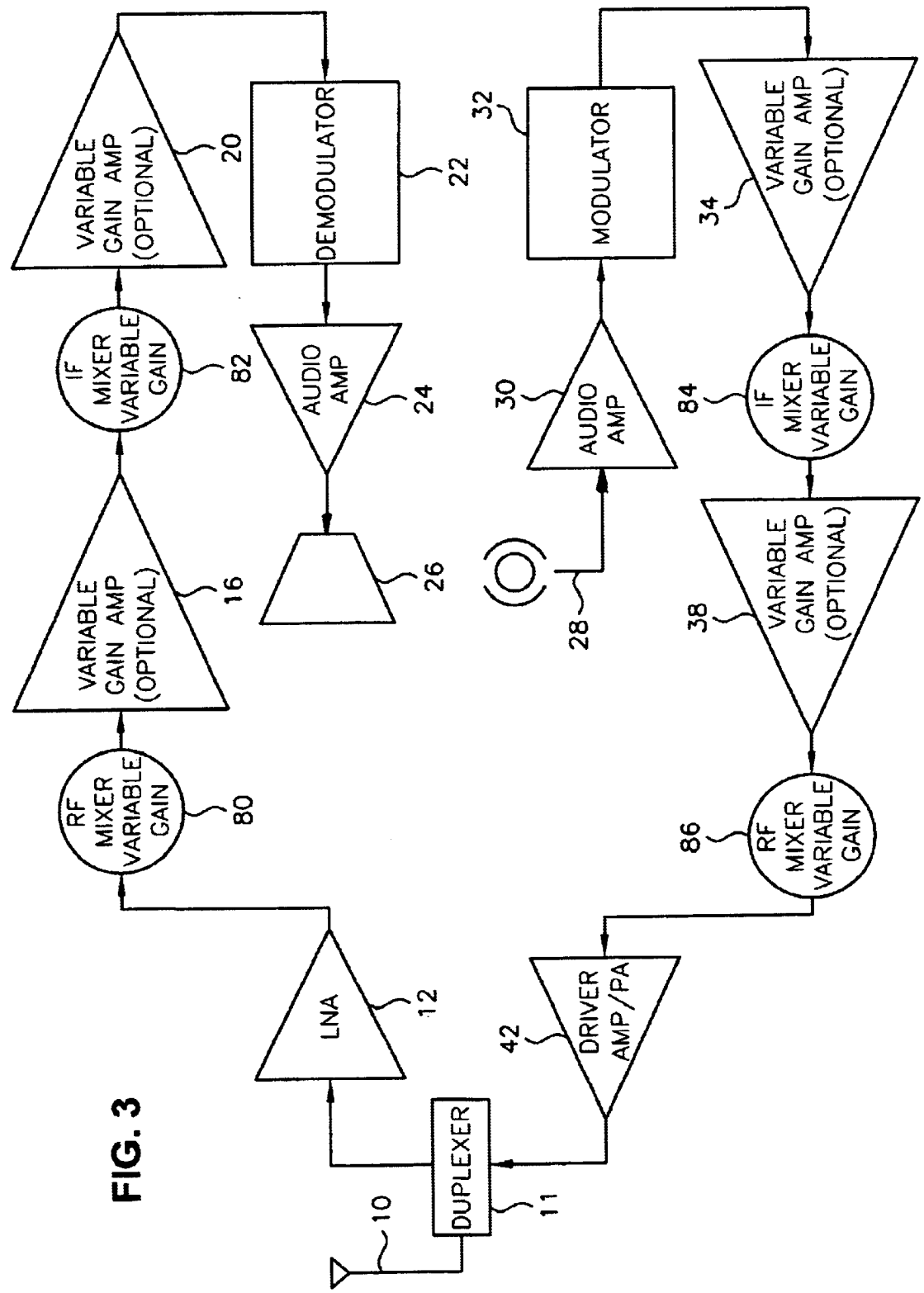
FIG. 3 is a block diagram of a wireless communications transceiver system constructed in accordance with the present invention.

FIG. 3 is a block diagram of a wireless communications transceiver system constructed in accordance with the present invention. The FIG. 3 wireless communications transceiver system is very similar to the wireless communications transceiver system of FIG. 1, with the following differences. The four mixers 80, 82, 84, and 86 are variable gain mixers and the inclusion of the variable gain amplifiers 16, 20, 34, and 38 is optional and dependent upon the design of the wireless communications transceiver system. The inclusion or omission of the variable gain amplifiers is determined by the needs of the system and the gain introduced by variable gain mixers 80, 82, 84, and 86.

Accordingly, the FIG. 3 wireless communications transceiver system includes an antenna 10 for receiving an incoming radio frequency input signal having a radio frequency carrier modulated by an incoming audio signal component and a diplexer 11 for conducting the incoming radio frequency input signal to a low noise amplifier 12 where it is amplified. The amplified radio frequency input signal is supplied to a first radio frequency variable gain mixer 80 that develops a differential mixed intermediate frequency input signal.

The differential mixed intermediate frequency input signal is supplied to a first intermediate frequency variable gain mixer 82, either directly or via a variable gain amplifier 16 depending on the design of the system, that develops a differential mixed low frequency input signal. The low frequency input signal is supplied to a demodulator 22, either directly or via a variable gain amplifier 20 depending on the design of the system, that detects the incoming audio signal component from the differential mixed low frequency input signal. A first audio amplifier 24 amplifies the incoming audio signal component and a speaker 26 converts the amplified incoming audio signal component to incoming audio.

A wireless communications transceiver system, constructed in accordance with the present invention also includes a microphone 28 for converting outgoing audio to an outgoing audio signal component. The outgoing audio signal component is amplified by a second audio amplifier 30 and the amplified outgoing audio signal component is supplied to a modulator 32 that develops an outgoing low frequency output signal having a low frequency carrier modulated by the outgoing audio signal component. The outgoing low frequency output signal is supplied to a second intermediate frequency variable gain mixer 84, either directly or via a variable gain amplifier 34 depending on the design of the system, that develops a differential mixed intermediate frequency output signal.

The intermediate frequency output signal is supplied to a second radio frequency variable gain mixer 86, either directly or via a variable gain amplifier 38 depending on the design of the system, that develops a differential mixed radio frequency output signal. The radio frequency signal is amplified by a driver amplifier 42 and the amplified radio frequency signal is conducted through diplexer 11 to antenna 10 for transmission.

Figure 4:
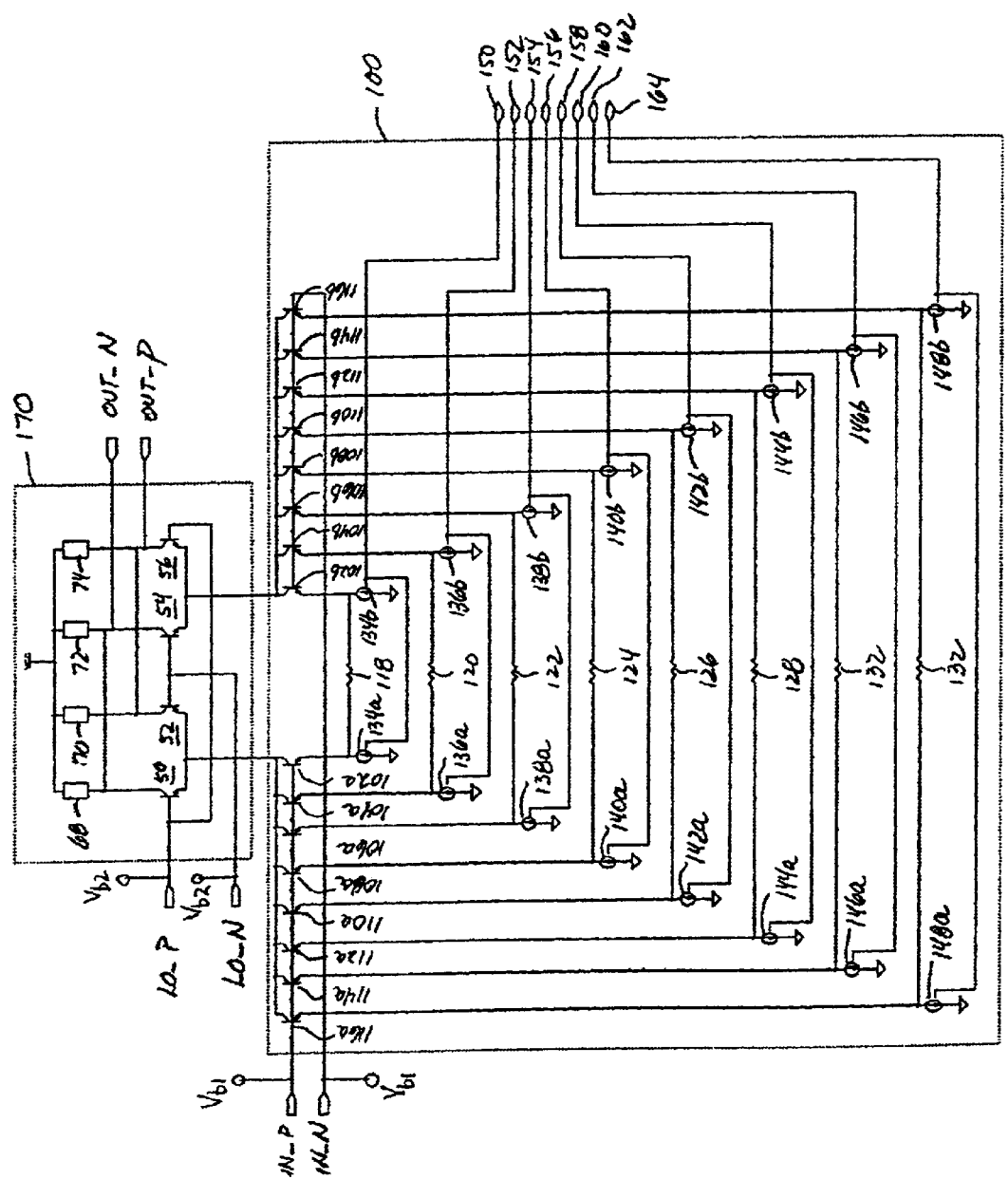
FIG. 4 is a circuit diagram of a first embodiment of a mixer constructed in accordance with the present invention that can be included in a wireless communications transceiver system such as the one illustrated in FIG. 3.
Figure 5:
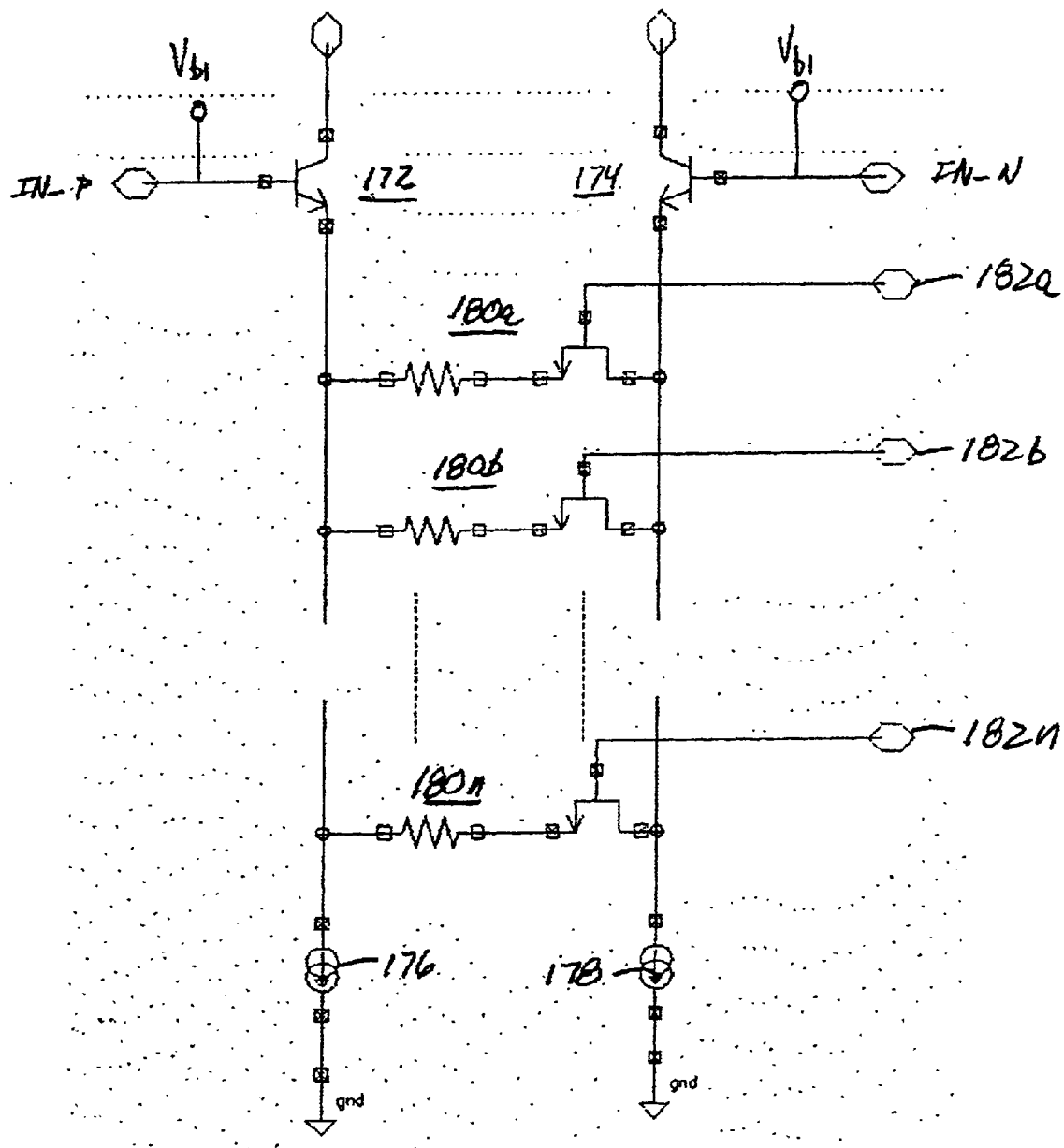
FIG. 5 is a circuit diagram of the input section circuit of a second embodiment of a mixer constructed in accordance with the present invention that can be included in a wireless communications transceiver system such as the one illustrated in FIG. 3.
Figure 6:
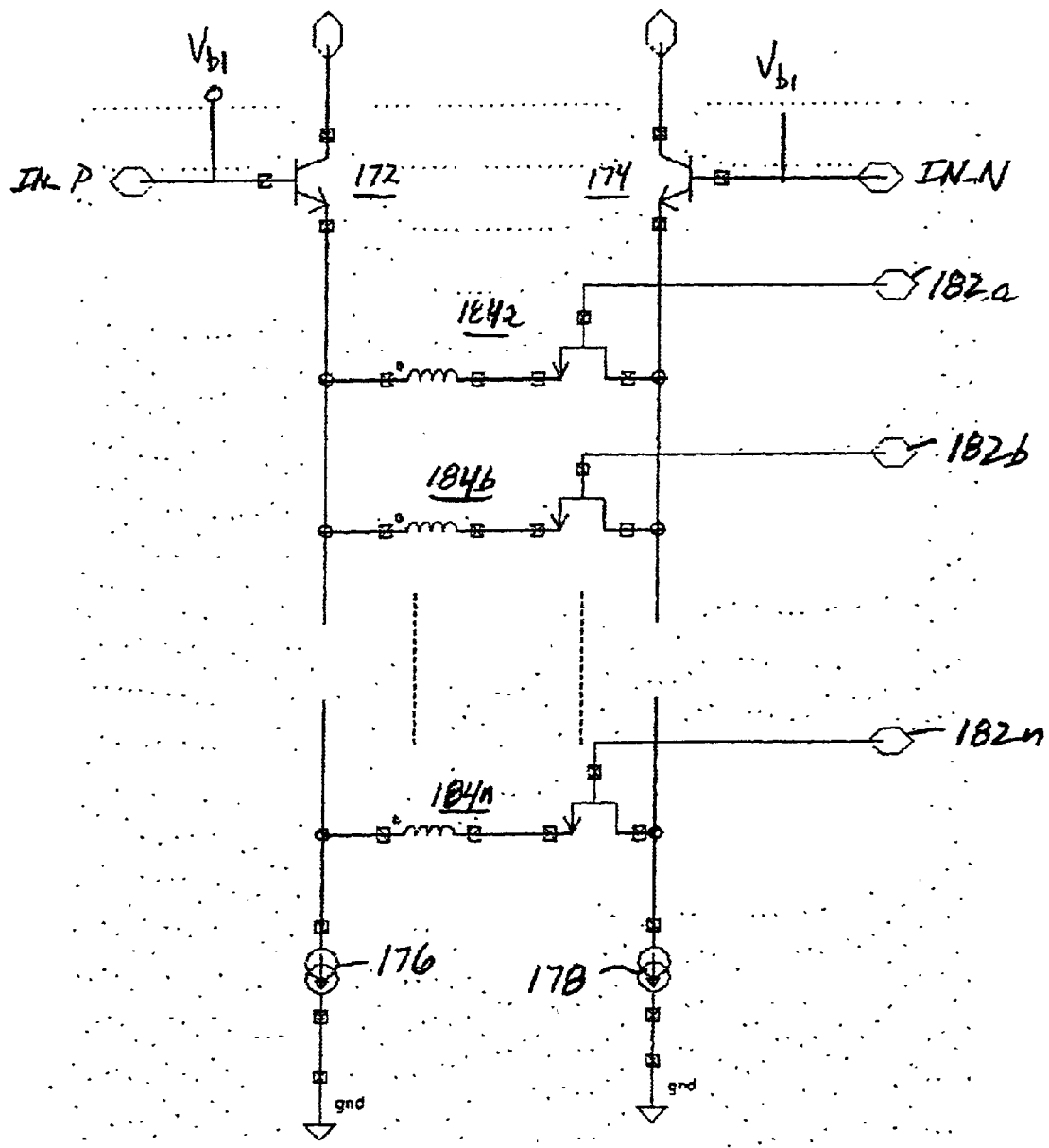
FIG. 6 is a circuit diagram of the input section circuit of a third embodiment of a mixer constructed in accordance with the present invention that can be included in a wireless communications transceiver system such as the one illustrated in FIG. 3.

Each radio frequency variable gain mixer 80 and 86 and each intermediate frequency variable gain mixer 82 and 84 includes means for supplying a local oscillator signal, an input section circuit responsive to an input signal (i.e., a radio frequency signal, an intermediate frequency signal, or a low frequency signal) for translating the input signal from a voltage signal to a pair of constant current signals, and a mixer core circuit responsive to the constant current signals and the local oscillator signal for developing a differential mixed signal (i.e., a radio frequency signal, an intermediate frequency signal, or a low frequency signal). FIGS. 4, 5 and 6 illustrate three embodiments of the variable gain mixers 80, 82, 84, and 86 constructed in accordance with the present invention.

Figure 3A:
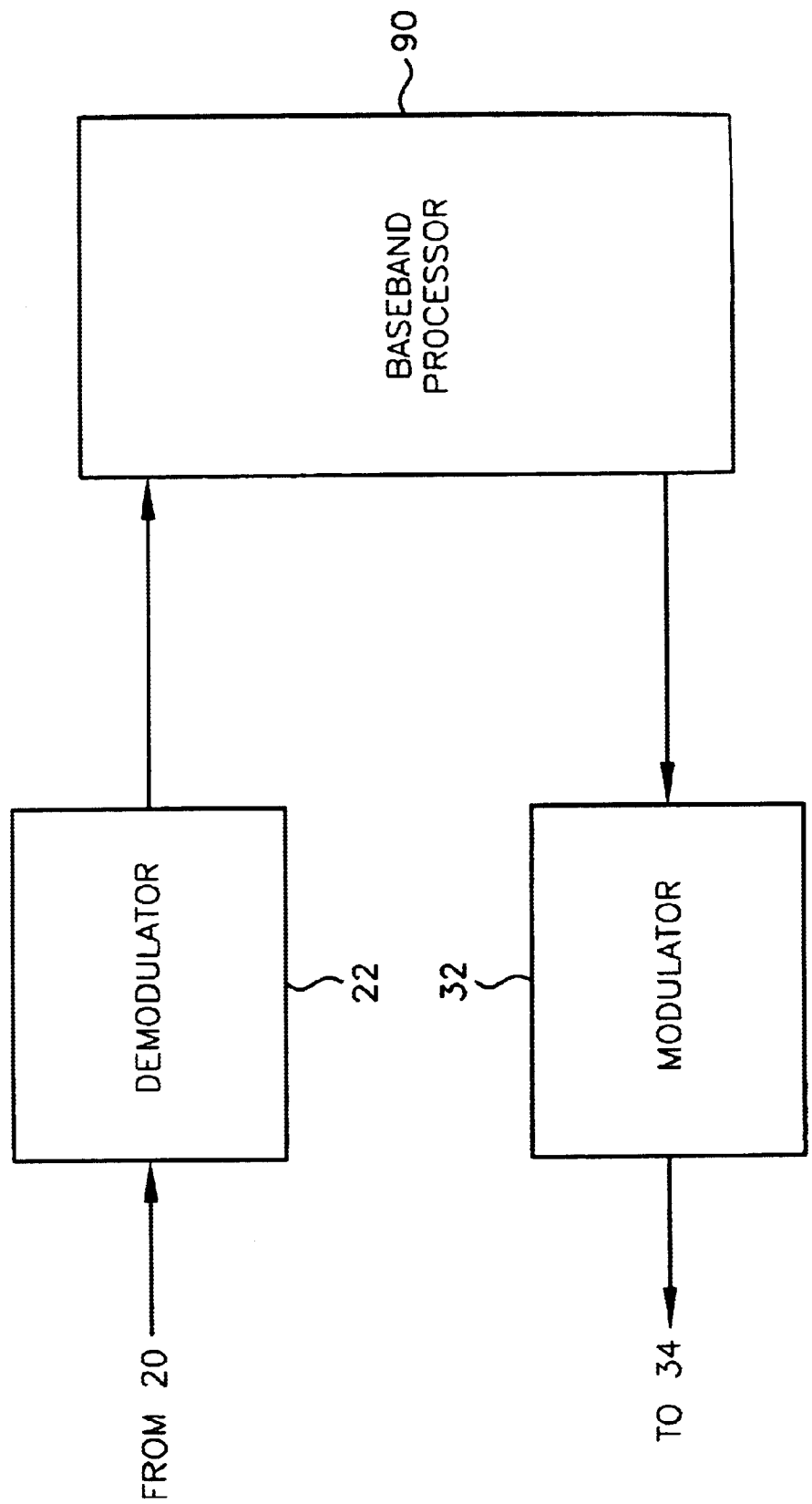
FIG. 3A is a block diagram of a portion of wireless communications transceiver system constructed in accordance with the present invention.

It should be noted that, while the information received or transmitted by the FIG. 3 wireless communications transceiver system has been described as audio, other forms of information, such as video or digital data, can be received or transmitted by a wireless communications transceiver system constructed in accordance with the present invention. This is indicated by FIG. 3A in which a block 90, identified as a baseband processor, represents the reception and transmission of a various forms of information by the FIG. 3 wireless communications transceiver system.

Referring to FIG. 4, the input section circuit 100 of the variable gain mixer, constructed in accordance with the present invention, includes a plurality of pairs of transducers with each pair of transducers connected in a differential configuration and the outputs of a first of each pair of the transducers connected together for supplying one of the constant current signals and the outputs of a second of each pair of the transducers connected together for supplying the other of the constant current signals. For the embodiment of the invention illustrated in FIG. 4, the pairs of transducers are pairs of identical transistors 102a, 102b . . . 116a, 116b. The inputs, namely the bases, of a first of each pair of the transistors are connected together for receiving the input signal applied at the input port IN P and IN N and the inputs, namely the bases, of a second of each pair of the transistors are connected together for receiving the input signal applied at the input port IN P and IN N.

The input section circuit of the FIG. 4 variable gain mixer also includes a plurality of impedances, in the form of resistors 118 . . . 132, each connected between a first of each pair of the transistors and a second of each pair of the transistors, namely between the emitters of 102a and 102b . . . 116a and 116b. In particular, resistors 118 . . . 132 are connected between the emitters of transistors pairs 102a, 102b . . . 116a, 116b. Resistors 118 . . . 132 act as emitter degeneration.

The input section circuit 100 of the FIG. 4 variable gain mixer also includes a plurality of pairs of identical constant current sources 134a, 134b . . . 148a, 148b. Resistors 118 . . . 132 are connected between pairs of constant current sources 134a, 134b . . . 148a, 148b. A first of each pair of the constant current sources is connected in series with a first of each pair of the transistors 102a, 102b . . . 116a, 116b and a second of each pair of the constant current sources connected in series with a second of each pair of the transistors 102a, 102b . . . 116a, 116b. A first of each pair of constant current sources 134a, 134b . . . 148a, 148b supplies the first constant current signal and a second of each pair of the constant current sources supplies the second constant current signal.

Constant current sources 134a, 134b . . . 148a, 148b are normally OFF. Accordingly, the input section 100 of the FIG. 4 variable gain mixer also includes means for selectively activating a pair of the constant current sources to produce the first constant current signal at the output (i.e., the collector) of the transistor connected in series with the activated first constant current source and the second constant current signal at the output (i.e., the collector) of the transistor connected in series with the activated second constant current source. Such means are presented by a plurality of terminals 150 . . . 164 to which control signals are applied selectively to activate that pair of constant current sources 134a, 134b . . . 148a, 148b associated with that pair of transistors 102a, 102b . . . 116a, 116b and resistor 118 . . . 132 associated with the activated constant current sources that will produce the desired gain for the mixer.

As indicated in FIG. 4, transistor pairs 102a, 102b . . . 116a, 116b are connected to a DC bias voltage source that biases the transistor pairs with a DC bias voltage $V_{b1}$. In contrast to prior art variable gain mixers, in which the gain is varied by varying the bias voltage, the bias voltage of a variable gain mixer constructed in accordance with the present invention is fixed, so that the currents at the outputs of transistors 102a, 102b . . . 116a, 116b that are connected in series with the pair of activated constant current sources 134a, 134b . . . 148a, 148b are constant. The gain of this mixer is varied by the value of the emitter degeneration resistor 118 . . . 132 that is connected between the pair of constant current sources 134a, 134b . . . 148a, 148b that is activated.

The mixer core circuit 170 of the FIG. 4 mixer includes four transistors 50, 52, 54 and 56 connected as a doubly-balanced switching modulator. The mixer core circuit 170, responsive to the constant current signals and the local oscillator signal applied at local oscillator port LO P and LO N. develops a differential mixed output signal at an output port OUT P and OUT N that is the product of the current signals and the local oscillator signal. Because of the fixed DC bias voltage $V_{b2}$ applied to transistors 50, 52, 54 and 56 from a DC bias voltage source, the output currents at output port OUT P and OUT N are constant. The gain of the mixer is determined by the ratio of the impedance of each of the loads 68, 70, 72, and 74 and the resistance of that emitter degeneration resistor 118 . . . 132 that is connected between the pair of constant current sources 134a, 134b . . . 148a, 148b that is activated.

By maintaining a constant DC current, the linearity of a variable gain mixer, constructed in accordance with the present invention, is maintained constant. In addition, because harmonic distortion changes with changes in the DC current, there are no changes in harmonic rejection with a variable gain mixer constructed in accordance with the present invention.

Referring to FIG. 5, which is a circuit diagram of the input section circuit of a second embodiment of a mixer constructed in accordance with the present invention, this input section circuit includes a single pair transducers, in the form of transistors 172 and 174, connected in a differential configuration, a single pair of constant current sources 176 and 178, and a plurality of series-connected resistor/FET branches 180a . . . 180n. In this embodiment of a mixer constructed in accordance with the present invention, the gain of the mixer is established by selectively activating one of the FET's by application of a control signal at one of a plurality of terminals 182a . . . 182n and connecting into the circuit the emitter degeneration resistor connected in series with the activated FET. With a fixed bias voltage $V_{b1}$ applied to transistors 172 and 174 from a DC bias voltage source, the currents at the outputs of these transistors are constant. The input section circuit of FIG. 5 can be used with the mixer core circuit 170 illustrated in FIG. 4.

Referring to FIG. 6, which is a circuit diagram of the input section circuit of a third embodiment of a mixer constructed in accordance with the present invention, this input section circuit includes a single pair transducers, in the form of transistors 172 and 174, connected in a differential configuration, a single pair of constant current sources 176 and 178, and a plurality of series-connected inductor/FET branches 184a . . . 184n. In this embodiment of a mixer, constructed in accordance with the present invention, the gain of the mixer is established by selectively activating one of the FET's by application of a control signal at one of a plurality of terminals 182a . . . 182n and connecting into the circuit the emitter degeneration inductor connected in series with the activated FET. With a fixed bias voltage $V_{b1}$ applied to transistors 172 and 174 from a DC bias voltage source, the currents at the outputs of these transistors are constant. The input section circuit of FIG. 6 can be used with the mixer core circuit 170 illustrated in FIG. 4.

Although illustrated and described above with reference to certain specific embodiments, the present invention nevertheless is not intended to be limited to the details shown. Rather various modifications may be made in the details within the scope and range of equivalents of the claims and without departing from the spirit of the invention.

What is claimed:

1. A wireless communications transceiver system comprising:

an antenna for receiving an incoming radio frequency input signal having a radio frequency carrier modulated by an incoming audio signal component;

a low noise amplifier for amplifying the radio frequency input signal;

a first radio frequency variable gain mixer having:

(a) means for supplying a first local oscillator signal, (b) a first input section circuit responsive to the amplified radio frequency input signal for translating the amplified radio frequency input signal from a voltage signal to first and second constant current signals, and (c) a first mixer core circuit responsive to the first and second constant current signals and the first local oscillator signal for developing a differential mixed intermediate frequency input signal;

a first intermediate frequency variable gain mixer having:

(a) means for supplying a second local oscillator signal, (b) a second input section circuit responsive to the differential mixed intermediate frequency input signal for translating the differential mixed intermediate frequency input signal from a voltage signal to third and fourth constant current signals, and (c) a mixer core circuit responsive to the third and fourth constant current signals and the second local oscillator signal for developing a differential mixed low frequency input signal;

a demodulator for detecting the incoming audio signal component from the differential mixed low frequency input signal;

a first audio amplifier for amplifying the incoming audio signal component;

a speaker for converting the amplified incoming audio signal component to incoming audio;

a microphone for converting outgoing audio to an outgoing audio signal component;

a second audio amplifier for amplifying the outgoing audio signal component;

a modulator for developing an outgoing low frequency output signal having a low frequency carrier modulated by the outgoing audio signal component;

a second intermediate frequency variable gain mixer having:

(a) means for supplying a third local oscillator signal, (b) a third input section circuit responsive to the low frequency output signal for translating the low frequency output signal from a voltage signal to fifth and sixth constant current signals, and (c) a third mixer core circuit responsive to the fifth and sixth constant current signals and the third local oscillator signal for developing a differential mixed intermediate frequency output signal;

a second radio frequency variable gain mixer having:

(a) means for supplying a fourth local oscillator signal, (b) a fourth input section circuit responsive to the intermediate frequency output signal for translating the intermediate frequency output signal from a voltage signal to seventh and eighth constant current signals, and (c) a fourth mixer core circuit responsive to the seventh and eighth constant current signals and the fourth local oscillator signal for developing a differential mixed radio frequency output signal;

a driver amplifier for amplifying the radio frequency output signal; and an antenna for transmitting the amplified radio frequency output signal.

2. A wireless communications transceiver system according to claim 1 further comprising:

(a) a first variable gain amplifier between said first radio frequency variable gain mixer and said first intermediate frequency variable gain mixer, (b) a second variable gain amplifier between said first intermediate frequency variable gain mixer and said demodulator, (c) a third variable gain amplifier between said modulator and said second intermediate frequency variable gain mixer, and (d) a fourth variable gain amplifier between said second intermediate frequency variable gain mixer and said second radio frequency variable gain mixer.

3. A wireless communications transceiver system according to claim 1 wherein each of said input section circuits of said variable gain mixers includes:

(a) a plurality of pairs of transducers with each pair of transducers connected in a differential configuration and:

(1) the outputs of a first of each pair of said transducers connected together for supplying one of the constant current signals, (2) the outputs of a second of each pair of said transducers connected together for supplying the other of the constant current signals, (3) the inputs of a first of each pair of said transducers connected together for receiving the input signal, and (4) the inputs of a second of each pair of said transducers connected together for receiving the input signal, (b) a plurality of impedances each connected between a first of each pair of said transducers and a second of each pair of said transducers, (c) a plurality of pairs of constant current sources, a first of each pair of said constant current sources connected in series with a first of each pair of said transducers and a second of each pair of said constant current sources connected in series with a second of each pair of said transducers, and (d) means for selectively activating a pair of said constant current sources to produce:

(1) the first constant current signal at said output of said transducer connected in series with said activated first constant current source, and (2) the second constant current signal at said output of said transducer connected in series with said activated second constant current source.

4. A wireless communications transceiver system according to claim 2 wherein each of said input section circuits of said variable gain mixers further includes:

(a) a plurality of pairs of transducers with each pair of transducers connected in a differential configuration and:

(1) the outputs of a first of each pair of said transducers connected together for supplying one of the constant current signals, (2) the outputs of a second of each pair of said transducers connected together for supplying the other of the constant current signals, (3) the inputs of a first of each pair of said transducers connected together for receiving the input signal, and (4) the inputs of a second of each pair of said transducers connected together for receiving the input signal, (b) a plurality of impedances each connected between a first of each pair of said transducers and a second of each pair of said transducers, (c) a plurality of pairs of constant current sources, a first of each pair of said constant current sources connected in series with a first of each pair of said transducers and a second of each pair of said constant current sources connected in series with a second of each pair of said transducers, and (d) means for selectively activating a pair of said constant current sources to produce:

(1) the first constant current signal at said output of said transducer connected in series with said activated first constant current source, and (2) the second constant current signal at said output of said transducer connected in series with said activated second constant current source.

5. A wireless communications transceiver system according to claim 1 wherein each of said input section circuits of said variable gain mixers further includes:

(a) a plurality of pairs of current sources, a first of each pair of current sources supplying the first current signal and a second of each pair of current sources supplying the second current signal, (b) a plurality of pairs of transistors, a first of each pair individually connected in series with a first of each pair of said current sources and a second of each pair connected in series with a second of each pair of said current sources, (c) a plurality of resistors each connected between a first of each pair of said transistors and a second of each pair of said switches, and (d) means for selectively activating a pair of said current sources to produce:

(1) the first constant current signal at the collector of said transistor connected in series with a first of said pair of activated current sources, and (2) the second constant current signal at the collector of said transistor connected in series with a second of said pair of activated current sources.

6. A wireless communications transceiver system according to claim 2 wherein each of said input section circuits of said variable gain mixers includes:

(a) a plurality of pairs of current sources, a first of each pair of current sources supplying the first current signal and a second of each pair of current sources supplying the second current signal, (b) a plurality of pairs of transistors, a first of each pair individually connected in series with a first of each pair of said current sources and a second of each pair connected in series with a second of each pair of said current sources, (c) a plurality of resistors each connected between a first of each pair of said transistors and a second of each pair of said switches, and (d) means for selectively activating a pair of said current sources to produce:
  (1) the first constant current signal at the collector of said transistor connected in series with a first of said pair of activated current sources, and
  (2) the second constant current signal at the collector of said transistor connected in series with a second of said pair of activated current sources.

7. A wireless communications transceiver system according to claim 1 wherein each of said input section circuits of said variable gain mixers includes:
  (a) a pair transducers connected in a differential configuration,
  (b) a pair of constant current sources connected in series individually with said pair of transducers,
  (c) a plurality of series-connected resistor/FET branches connected in parallel and between said pair of transducers; and
  (d) means for selectively activating one of said FET's in one of said series-connected resistor/FET branches.

8. A wireless communications transceiver system according to claim 2 wherein each of said input section circuits of said variable gain mixers includes:
  (a) a pair transducers connected in a differential configuration,
  (b) a pair of constant current sources connected in series individually with said pair of transducers,
  (c) a plurality of series-connected resistor/FET branches connected in parallel and between said pair of transducers; and
  (d) means for selectively activating one of said FET's in one of said series-connected resistor/FET branches.

9. A wireless communications transceiver system according to claim 1 wherein each of said input section circuits of said variable gain mixers includes:
  (a) a pair transducers connected in a differential configuration,
  (b) a pair of constant current sources connected in series individually with said pair of transducers,
  (c) a plurality of series-connected inductor/FET branches connected in parallel and between said pair of transducers; and
  (d) means for selectively activating one of said FET's in one of said series-connected inductor/FET branches.

10. A wireless communications transceiver system according to claim 2 wherein each of said input section circuits of said variable gain mixers includes:
  (a) a pair transducers connected in a differential configuration,
  (b) a pair of constant current sources connected in series individually with said pair of transducers,
  (c) a plurality of series-connected inductor/FET branches connected in parallel and between said pair of transducers; and
  (d) means for selectively activating one of said FET's in one of said series-connected inductor/FET branches.

11. A variable gain mixer comprising:
means for supplying a first input signal;
means for supplying a second input signal;
an input section circuit responsive to the first input signal for translating the first input signal from a voltage signal to first and second constant current signals and having:
  (a) a plurality of pairs of transducers with each pair of transducers connected in a differential configuration and:
    (1) the outputs of a first of each pair of transducers connected together for supplying a first of the first and second constant current signals,
    (2) the outputs of a second of each pair of transducers connected together for supplying a second of the first and second constant current signals,
    (3) the inputs of a first of each pair of transducers connected together for receiving the first input signal,
    (4) inputs of a second of each pair of transducers connected together and for receiving the first input signal,
  (b) a plurality of resistors each connected between a first of each pair of said transducers and a second of each pair of said transducers, and
  (c) a plurality of pairs of constant current sources, a first of each pair connected in series with a first of each pair of said transducers and a second of each pair connected in series with a second of each pair of said transducers;
means for selectively activating a pair of said constant current sources to produce:
  (a) the first constant current signal at said output of said transducer connected in series with said activated first constant current source, and
  (b) the second constant current signal at said output of said transducer connected in series with said activated second constant current source; and.
a mixer core circuit responsive to the first and second constant current signals and the second input signal for developing a differential mixed output signal that is the product of the constant current signals and the second input signal.

12. A variable gain mixer according to claim 11 wherein said mixer core circuit includes four transistors connected as a doubly-balanced switching modulator.

13. A variable gain mixer comprising:
means for supplying a first input signal;
means for supplying a second input signal;
an input section circuit responsive to the first input signal for translating the first input signal from a voltage signal to first and second constant current signals and having:
  (a) a plurality of pairs of current sources, a first of each pair of said current sources supplying the first constant current signal and a second of each pair of said current sources supplying the second constant current signal,
  (b) a plurality of pairs of transistors, a first of each pair of said transistors individually connected in series with a first of each pair of said current sources and a second of each pair of said transistors connected in series with a second of each pair of said current sources, and
  (c) a plurality of resistors each connected between a first of each pair of said transistors and a second of each pair of said transistors;

means for selectively activating a pair of said current sources to produce:
(a) the first constant current signal at the collector of said transistor connected in series with a first of said pair of activated current sources, and
(b) the second constant current signal at the collector of said transistor connected in series with a second of said pair of activated current sources; and.
a mixer core circuit responsive to the first and second constant current signals and the second input signal and including four transistors connected as a doubly-balanced switching modulator for developing a differential mixed output signal that is the product of the current signals and the second input signal.

14. A variable gain mixer comprising:
means for supplying a first input signal;
means for supplying a second input signal;
an input section circuit responsive to the first input signal for translating the first input signal from a voltage signal to first and second constant current signals and having:
(a) a pair transducers connected in a differential configuration,
(b) a pair of constant current sources connected in series individually with said pair of transducers,
(c) a plurality of series-connected resistor/FET branches connected in parallel and between said pair of transducers,
(d) means for selectively activating one of said FET's in one of said series-connected resistor/FET branches to produce:
(1) the first constant current signal at a first output of said first transducer, and
(2) the second constant current signal at a second output of said second transducer; and.
a mixer core circuit responsive to the first and second constant current signals and the second input signal for developing a differential mixed output signal that is the product of the current signals and the second input signal.

15. A variable gain mixer according to claim 14 wherein said mixer core circuit includes four transistors connected as a doubly-balanced switching modulator.

16. A variable gain mixer comprising:
means for supplying a first input signal;
means for supplying a second input signal;
an input section circuit responsive to the first input signal for translating the first input signal from a voltage signal to first and second constant current signals and having:
(a) a pair transducers connected in a differential configuration,
(b) a pair of constant current sources connected in series individually with said pair of transducers,
(c) a plurality of series-connected inductor/FET branches connected in parallel and between said pair of transducers,
(d) means for selectively activating one of said FET's in one of said series-connected inductor/FET branches to produce:
(1) the first constant current signal at a first output of said first transducer, and
(2) the second constant current signal at a second output of said second transducer; and.
a mixer core circuit responsive to the first and second constant current signals and the second input signal for developing a differential mixed output signal that is the product of the current signals and the second input signal.

17. A variable gain mixer according to claim 16 wherein said mixer core circuit includes four transistors connected as a doubly-balanced switching modulator.

18. A variable gain mixer according to claim 13 wherein:
(a) said input section circuit further includes a first fixed DC bias voltage source connected to said plurality of pairs of transistors so that the currents at the outputs of said transistors that are connected in series with the pair of activated constant current sources are constant, and
(b) said mixer core circuit further includes a second fixed DC bias voltage source connected to said four transistors so that the differential mixed output signal is a constant current signal.

19. A variable gain mixer according to claim 15 wherein:
(a) said transducers in said input section circuit are transistors,
(b) said input section circuit further includes a first fixed DC bias voltage source connected to said transistors in said input section circuit so that the currents at the outputs of said transistors in said input section circuit that are connected in series with the pair of activated constant current sources are constant, and
(c) said mixer core circuit further includes a second fixed DC bias voltage source connected to said four transistors so that the differential mixed output signal is a constant current signal.

20. A variable gain mixer according to claim 17 wherein:
(a) said transducers in said input section circuit are transistors,
(b) said input section circuit further includes a first fixed DC bias voltage source connected to said transistors in said input section circuit so that the currents at the outputs of said transistors in said input section circuit that are connected in series with the pair of activated constant current sources are constant, and
(c) said mixer core circuit further includes a second fixed DC bias voltage source connected to said four transistors so that the differential mixed output signal is a constant current signal.

* * * * *